(12) United States Patent  (10) Patent No.: US 8,902,133 B2
Nakamura  (45) Date of Patent: Dec. 2, 2014

(54) SURFACE-EMISSION DISPLAY DEVICE HAVING PIXELS WITH REDUCED WIRING RESISTANCE

(75) Inventor: Hideyo Nakamura, Ichihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 1046 days.

(21) Appl. No.: 12/733,114

(22) PCT Filed: Jul. 2, 2008

(86) PCT No.: PCT/JP2008/061967
§ 371 (c)(1),
(2), (4) Date: May 14, 2010

(87) PCT Pub. No.: WO2010/001467
PCT Pub. Date: Jan. 7, 2010

(65) Prior Publication Data
US 2010/0289729 A1  Nov. 18, 2010

(51) Int. Cl.
*G09G 3/30* (2006.01)
*H01L 27/32* (2006.01)

(52) U.S. Cl.
CPC ..... *H01L 27/3276* (2013.01); *H01L 2251/5315* (2013.01)
USPC .......................................................... 345/76

(58) Field of Classification Search
USPC ...................................... 345/76–81; 257/207
See application file for complete search history.

(56) References Cited

U.S. PATENT DOCUMENTS 5,289,036 A * 2/1994 Nishimoto ..................... 257/774
5,748,550 A * 5/1998 Jeon et al. ...................... 257/207

| | | |
|---|---|---|
| 2003/0052851 A1 | 3/2003 | Yano et al. |
| 2004/0027343 A1 | 2/2004 | Matsumoto |
| 2005/0162355 A1* | 7/2005 | Yamazaki ........................ 345/76 |
| 2006/0063298 A1 | 3/2006 | Winters |
| 2006/0208962 A1* | 9/2006 | Sekiya ............................. 345/45 |
| 2006/0208979 A1* | 9/2006 | Fish et al. ........................ 345/81 |
| 2007/0023897 A1* | 2/2007 | Nakajima et al. ............. 257/728 |
| 2008/0204377 A1* | 8/2008 | Kajiyama et al. ............... 345/76 |
| 2009/0026506 A1* | 1/2009 | Matsumiya et al. ........... 257/272 |

FOREIGN PATENT DOCUMENTS

| | | |
|---|---|---|
| JP | 3770368 | 12/2000 |
| JP | 2003-084727 A | 3/2003 |
| JP | 2003-108070 A | 4/2003 |
| JP | 2003-330387 A | 11/2003 |
| JP | 2004-004192 A | 1/2004 |
| JP | 2004-356052 A | 12/2004 |
| JP | 2006-018277 A | 1/2006 |
| JP | 2006-091119 A | 4/2006 |
| JP | 2006-098619 A | 4/2006 |
| JP | 2006-098977 A | 4/2006 |
| JP | 2006-163384 A | 6/2006 |
| JP | 2008-513960 | 5/2008 |
| TW | 200723229 | 6/2007 |

* cited by examiner

*Primary Examiner* — Ryan A Lubit
(74) *Attorney, Agent, or Firm* — Rabin & Berdo, P.C.

(57) ABSTRACT

A flat panel display device includes a circuit board (110) that has formed thereon a plurality of power source lines (210) arranged in parallel, a power source bus (220) to which the plurality of power source lines (210) are connected, and a plurality of pixel circuits (240) each having an inner line path (66) connected to one of the power source lines (210). The display device also includes a plurality of light-emitting elements, each driven by a transistor provided in a corresponding one of pixel circuits (240). The inner line path (66) of each pixel circuit (240) provides a bypass path with respect to the power source line (210) connected thereto and part of the wiring for the transistor of the pixel circuit (240).

26 Claims, 13 Drawing Sheets

ID DISPLAY DEVICE
SURFACE-EMISSION DISPLAY DEVICE HAVING PIXELS WITH REDUCED WIRING RESISTANCE

CROSS-REFERENCE TO RELATED APPLICATION

This application claims the benefit of international application PCT/JP2008/061967, filed on Jul. 2, 2008, the disclosure of which is incorporated herein by reference.

BACKGROUND OF THE INVENTION

The present invention relates to a flat panel display device, particularly to a thin display such as an organic EL panel and a liquid-crystal panel.

An active matrix organic EL display is known as an example of a thin display. A representative configuration of a panel unit of the active matrix EL display is shown in FIG. 1. This panel unit has a configuration in which a color filter substrate 12 is adhesively attached to a circuit board (TFT substrate) 11 having light-emitting elements (for example, organic EL elements) or pixel circuits formed thereof. The reference numeral 13 in the figure denotes an outer peripheral seal region.

FIG. 2A is a schematic diagram illustrating the wiring configuration of the circuit board 11. A plurality of power source lines 21 arranged parallel to each other in the vertical direction and a power source bus 22 connected to these power source lines 21 and led out to an anode power source terminal (GND terminal) 23 are present on the circuit board 11. A plurality of pixel circuits 24 are connected to each power source line 21.

In such a circuit board 11, a planarizing resin layer is usually provided and concavities and convexities produced by TFT (Thin Film Transistors) or the like of the pixel circuits 24 are planarized by the planarizing resin layer. Contact holes 27 for connecting the pixel circuits 24 and the light-emitting elements are provided in the planarizing resin layer.

Each pixel circuit 24 is connected to a data control circuit 17 via a data signal line (course signal line) 25 and connected to a gate control circuit 18 via a scan signal line (gate signal line) 26.

FIG. 2B is a schematic diagram illustrating only the wiring to a power source. As shown in the figure, wirings extending in one direction, rather than solid- or mesh-like wirings, are often used for wiring the power source lines 21. With such wirings, the transverse sectional area of the power source lines 21 related to the data signal lines 25 and scan signal lines 26 shown in FIG. 2A is reduced and capacitance between wirings is decreased. Therefore, signal delay caused by the capacitance between the wirings can be inhibited. Yet another advantage is that when the pixels are small, the surface area of a transistor in the pixel surface 24 can be increased, although slightly. The reference numeral 16 denotes an integrated control circuit (a data control circuit 17 and a gate control circuit 18).

A representative configuration of the pixel circuit 24 is shown in FIG. 3. This pixel circuit 24 is used for driving a liquid crystal or an organic EL element and provided with a TFT 32 that is a drive transistor and a TFT 33 that is a control transistor. The source and gate of the TFT 33 are connected to the data signal line 25 and the scan signal line 26, respectively.

In this pixel circuit 24, an electrode to which a voltage VDD is applied (an upper transparent electrode to which all the pixel circuits 24 are commonly connected) is an anode. Ground or GND, to which the source of the TFT 32 is connected, is a cathode. The reference numeral 34 denotes a capacitor.

The structure of a pixel portion provided at the panel shown in FIG. 1 will be described below. FIG. 4A is a plan view of the pixel portion. FIG. 4B and FIG. 4C are cross-sectional views along the A-A line and B-B line in FIG. 4A.

As shown in FIGS. 4B and 4C, a planarizing resin layer 40 is present on a glass substrate 37. As mentioned hereinabove, this planarizing resin layer 40 is provided to planarize the concavities and convexities generated by the TFTs or the like of the pixel circuits 24. The planarizing resin layer 40 is covered, if necessary, with an inorganic passivation film.

A reflective electrode 42 is disposed, via a base layer 41 serving to improve adhesion, on the planarizing resin layer 40, and an insulating film 43 having an opening is formed at the light-emitting portion herein. Then, a plurality of organic film portions 44 are vapor deposited, and a transparent electrode layer 45 is formed thereupon. The transparent electrode layer 45 referred to herein is called an upper transparent electrode layer. A transparent layer composed of an oxide such as IZO or ITO or a half-mirror-shaped metal film with a thickness of from several nanometers to ten odd nanometers can be provided as the upper transparent electrode layer 45.

FIG. 5A is a schematic diagram of a wiring relating only to the transparent electrode layer 45. Furthermore, FIG. 5B is a cross-sectional view along the C-C line in FIG. 5A. Because the transparent electrode layer 45 is a common electrode for all the pixels, the layer has a solid wiring structure (surface wiring structure), as shown by the reference numeral 53 in FIG. 5A. The transparent electrode layer 45 is connected at the outer peripheral portion of the panel to a power source bus 51 that is different from the above-described one and led out to a terminal 52. The entire surface of the transparent electrode layer 45 is covered with a barrier layer 46.

The configuration described above is on the side of the circuit substrate 11 shown in FIG. 1.

Meanwhile, a black matrix 47, a color filter 48, and optionally a bank partition wall 39 or a color conversion layer 49 are formed on the glass substrate 38 on the side of the color filter substrate 12 shown in FIG. 1. It goes without saying that there are also systems using no bank partition wall 39 or color conversion layer 49. Furthermore, if necessary, a spacer 50 can be also provided.

The circuit board 11 and color filter substrate 12 are adhesively joined together with alignment ensuring the appropriate formation of pixels. A gap layer 54 is typically configured by a solid material such as an adhesive, but it is also sometimes configured by a liquid or gas.

In the circuit board 11 such as shown in FIG. 2A and FIG. 2B, the wiring resistance cannot be ignored because thick-film wiring such as a printed circuit board is difficult. Therefore, in the case of a display using current-driven self-emission elements, such as an organic EL panel, the current flowing in the power source lines 21 is higher than that in a display using liquid crystals or the like. As a result, voltage drop (rise) at the power source lines 21 or power source bus 22 increases.

The aforementioned voltage drop (rise) not only increases power consumption, but also causes in-screen distribution of voltage applied to light-emitting elements, thereby causing brightness unevenness.

Furthermore, when the pixel circuit 24 has a configuration such as shown in FIG. 3, in particular, when the GND potential rises, a gate control voltage of the TFT 32 fluctuates. As a result, even a slight in-plane distribution of potential causes a very large brightness unevenness. In this case, a very small number of pixels located close to the power source terminal 23 (see FIG. 2A and FIG. 2B), and having applied thereto a regular GND potential or a potential close thereto, become very bright. If such a state is allowed to stay and the average brightness of the entire panel is set, it can even lead to screen burning.

Accordingly, Japanese patent 3770368 suggests a technique for inhibiting such a phenomenon. The technique described in this reference involves electrically connecting a second conductor layer via contact holes to a power source line that is a first conductor layer, thereby forming a power source line path with a large cross section area combining those of the first conductor layer and the second conductor layer, that is, with a low electric resistance.

However, the technique described in Japanese patent 3770368 requires the addition of contact holes and the second conductive layer and, therefore, rises the production cost and increases the size.

SUMMARY OF THE INVENTION

Accordingly, it is an object of the present invention to provide a flat panel display device in which unevenness of brightness and an increase in power consumption caused by wiring resistance can be inhibited without changing the wiring material or causing a cost increase.

The present invention relates to the improvement of a flat panel display device having a circuit board that has formed thereon a plurality of power source lines arranged in parallel, a power source bus to which to the plurality of power source lines are connected, a plurality of pixel circuits each having an inner line path connected to the power source line, and a plurality of light-emitting elements each driven by a transistor provided in the plurality of pixel circuits. In order to resolve the above-descried problem, the inner line path of the pixel circuit is formed so as to configure a bypass path with respect to the power source line connected thereto and so as to configure part of wiring forming the transistor of the pixel circuit.

In an embodiment of the present invention, there are provided a planarizing layer for planarizing concavities and convexities formed by circuit elements on the circuit board, and a contact hole region formed in the planarizing layer to connect the pixel circuit to the light-emitting element, wherein part of the inner line path of the pixel circuit is located below the contact hole region.

For example, an organic EL element can be used as the light-emitting element. Furthermore, for example, a thin-film transistor can be used as the transistor.

In an embodiment, the inner line path of the pixel circuit comprises: a first line path portion having one end portion connected to the power line and another end portion provided with comb-shaped branch portions; and a second line path portion that connects at least one branch portion to the power source line to which the one end portion is connected. The first line path portion is formed as a wiring that forms a source of the transistor.

The pixel circuit can further comprise a third line path portion having comb-shaped branch portions meshing with the branch portions of the first line path portion. The third line path portion is formed as a wiring that forms a drain of the transistor.

Furthermore, in order to resolve the above-described problem, the present invention provides a surface-emission display device obtained by adding further a separate feature to the surface-emission display device having the above-described features. In order to adjust the potential of a connection site of the power source bus with each of the plurality of power source lines in this surface-emission display device, part of the power source bus is split by a slit extending from a power source terminal in the direction of the connection site.

In an embodiment of the present invention, a plurality of the slits are provided, and a potential of the connection site is adjusted by adjusting the number, length, and arrangement spacing of the slits.

In this invention, for example, an organic EL element can be used as the light-emitting element, and a thin-film transistor can be used as the transistor.

In accordance with the present invention, the inner line path of the pixel circuit configures a bypass path with respect to the power source line connected thereto. Therefore, the electric resistance of the power source line is reduced, thereby making it possible to inhibit brightness unevenness and reduce power consumption. Furthermore, because the bypass path is configured using part of the wiring forming a transistor of the pixel circuit or by using a contact hole region, the above-described effect can be obtained, without reducing the surface area of the transistor.

In addition, in accordance with the present invention, part of the power source bus is split by a slit extending from a power source terminal in the direction of the connection site, and means for adjusting the potential of the connection site of each power source line is further provided. As a result, the brightness unevenness can be inhibited with very high effectiveness and a high-quality flat panel display device can be realized at a low cost, without changing the process parameters such as materials and film thickness and without increasing a frame.

DESCRIPTION OF THE PREFERRED EMBODIMENTS

An embodiment of the present invention will be described below with reference to the appended drawings.

Figure 2A:
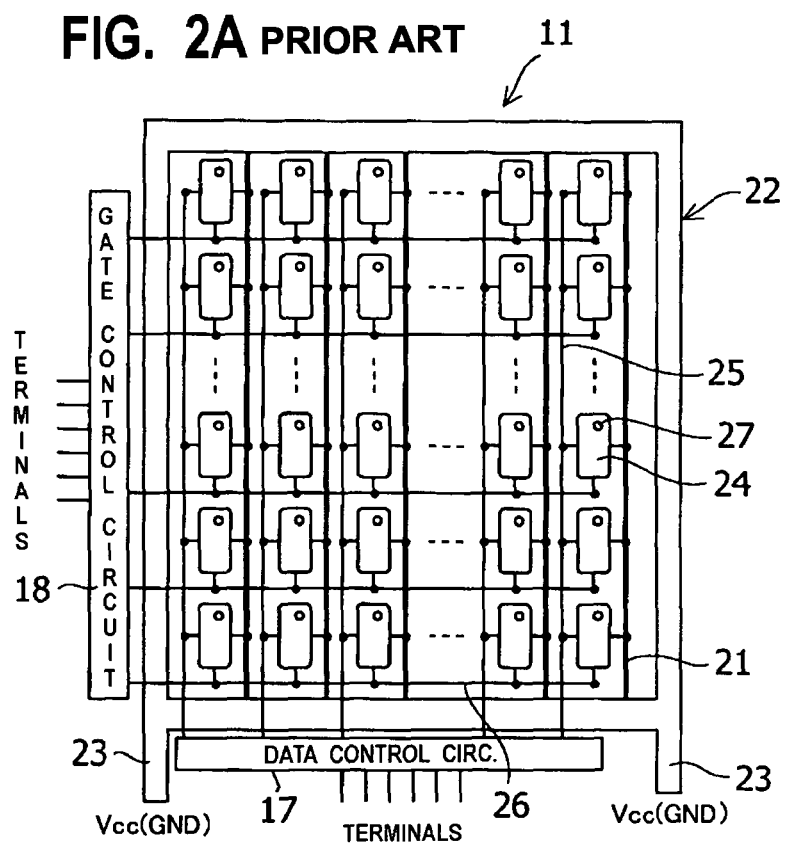
FIG. 2A is a schematic diagram illustrating an overall configuration of a cathode wiring of the conventional TFT substrate.
Figure 2B:
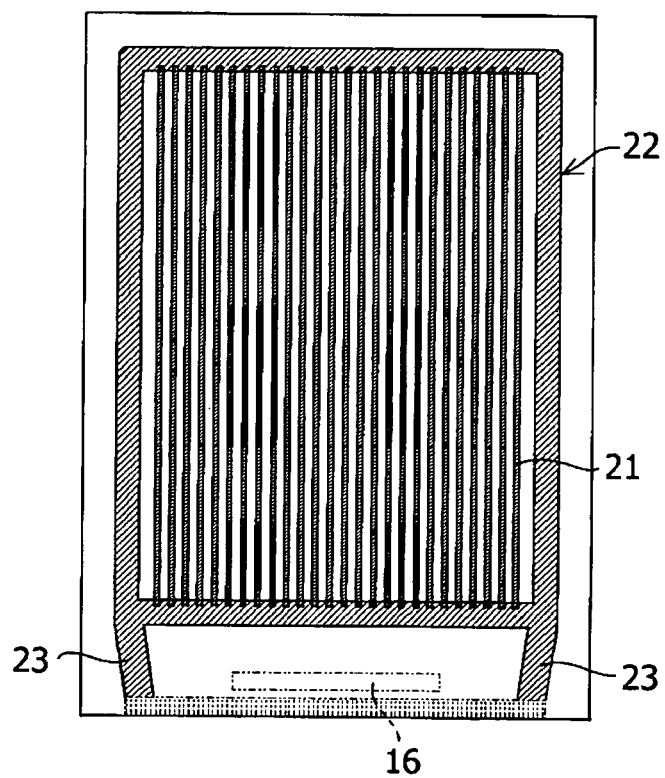
FIG. 2B is a schematic diagram of a cathode wiring of the conventional TFT substrate.
Figure 6:
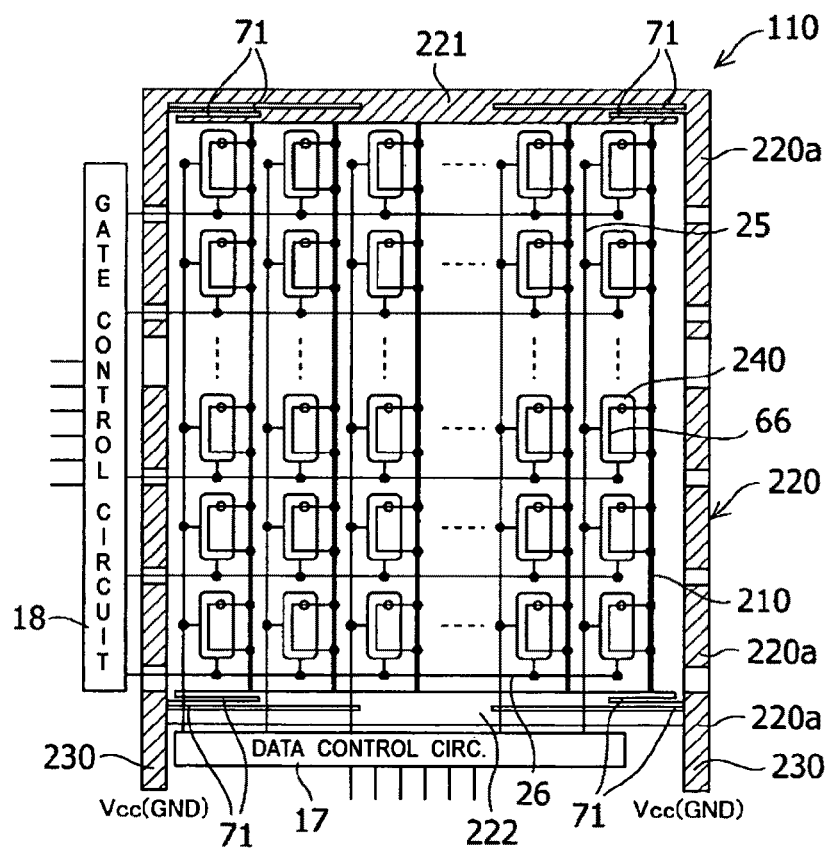
FIG. 6 is a schematic diagram illustrating the overall configuration of a circuit board in a flat panel display device of an embodiment of the present invention.

FIG. 6 is a schematic diagram of a circuit board 110 in a flat panel display device of the present embodiment. In FIG. 6, elements identical to the elements of the circuit board 11 shown in FIG. 2A are denoted by like reference numerals.

The flat panel display device of the present embodiment has a configuration similar to that of the flat panel display device shown in FIGS. 1 to 5B, except for the configuration of the circuit board 110. Accordingly, the configuration of the circuit board 110 is mainly what will be explained below.

The circuit board 110 is provided with power source lines 210, a power source bus 220, and pixel circuits 240. These components respectively correspond to the power source lines 21, power source bus 22, and pixel circuits 24 shown in FIG. 2A. The pixel circuit 240 has a configuration shown by way of example in FIG. 3, similarly to the pixel circuit 24 shown in FIG. 2A.

Figure 7A:
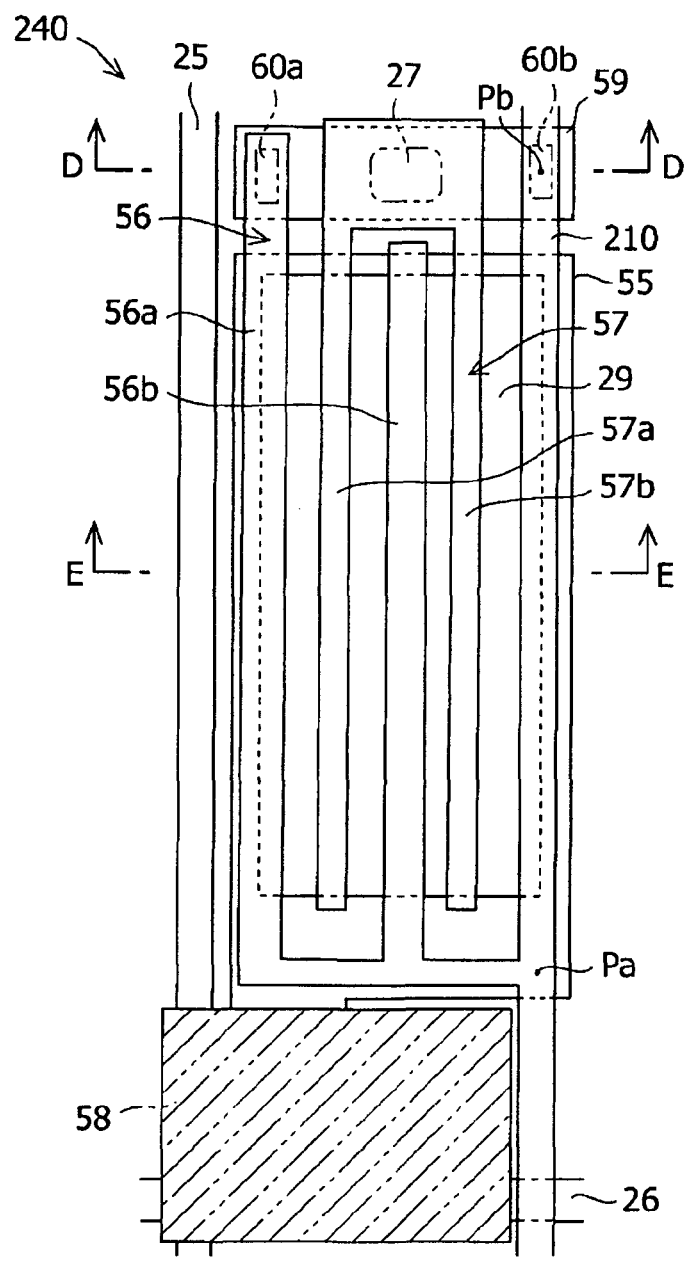
FIG. 7A is a schematic diagram illustrating an example of the wiring structure of a pixel circuit.

FIG. 7A shows schematically an example of the wiring structure of the pixel circuit 240. In this wiring structure, a gate wiring pattern 55 is formed as a first-layer metal wiring pattern, and a source wiring pattern 56, a drain wiring pattern 57, and the power source lines 210 are formed as respective second-layer metal wiring patterns on an insulating layer 61 (see FIG. 7C) over the gate wiring pattern. Reference number 29 identifies an Si layer.

An element region 58 for gate control is provided adjacently to the gate wiring pattern 55. The element region 58 for gate control is provided with a TFT (Thin-Film Transistor) 33 and a capacitor 34 as shown in FIG. 3, and is connected to a data signal line (source signal line) 25 that is formed as a second-layer metal wiring pattern and a scan signal line (gate signal line) 26 that is formed as a first-layer metal wiring pattern.

Figure 3:
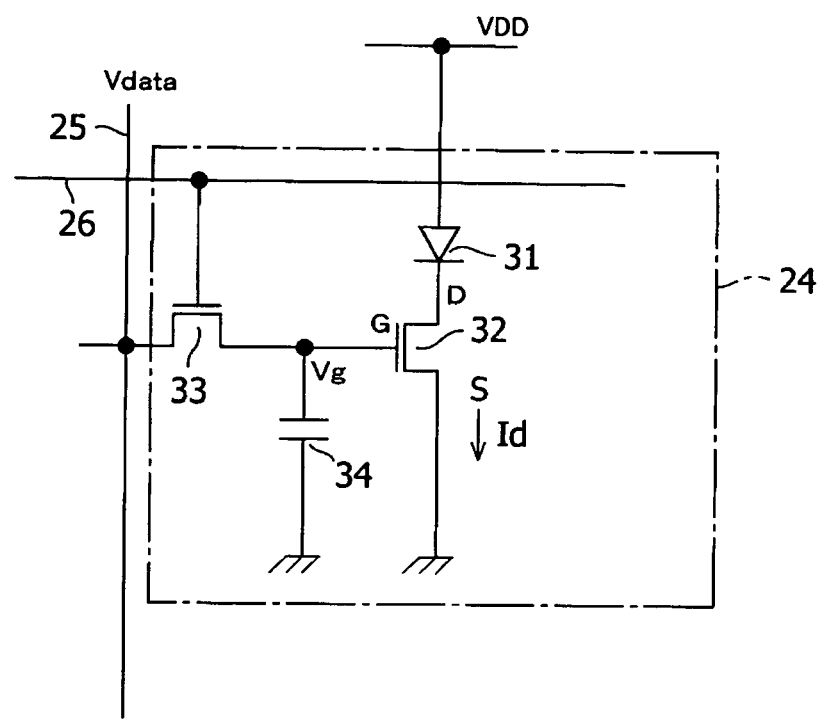
FIG. 3 is a circuit diagram illustrating an example of a pixel circuit of a typical TFT substrate.
Figure 4A:
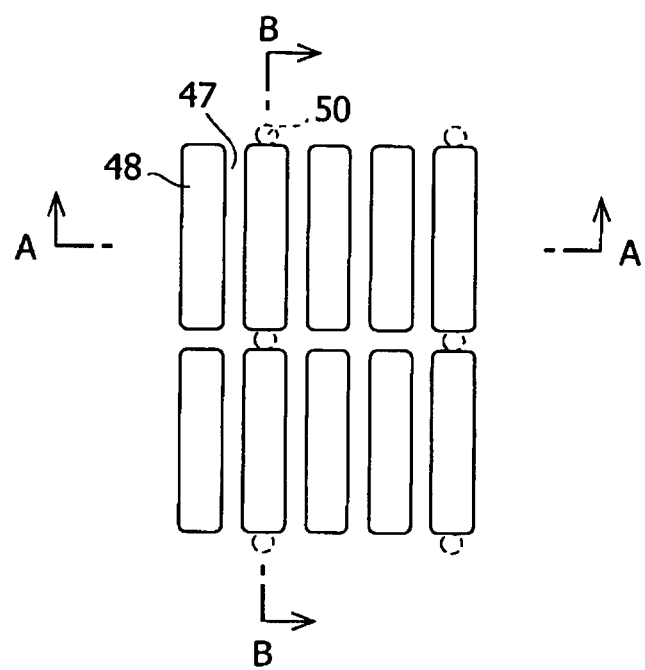
FIG. 4A is a plan view illustrating a pixel part of an organic EL panel of a top emission type.
Figure 4B:
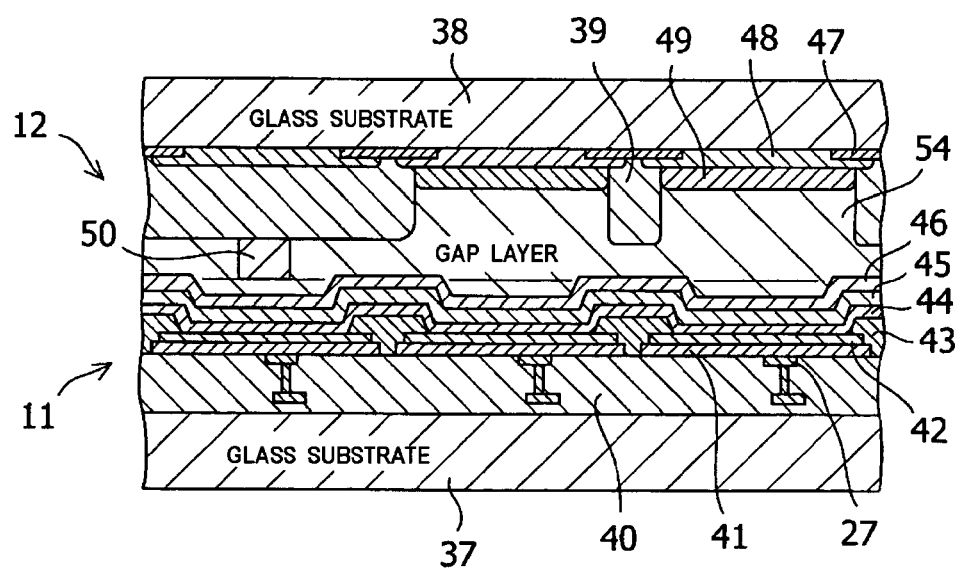
FIG. 4B is a cross-sectional view along the A-A line in FIG. 4A.
Figure 4C:
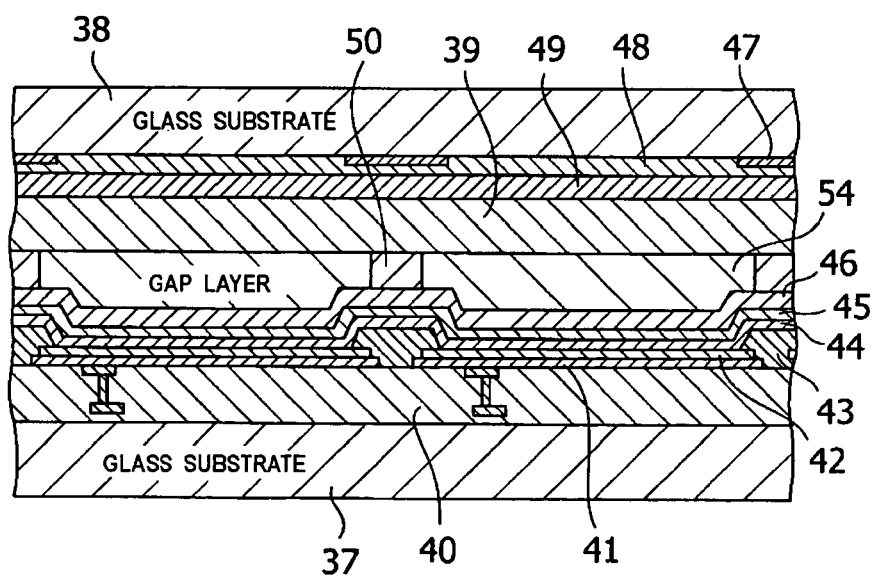
FIG. 4C is a cross-sectional view along the B-B line in FIG. 4A.
Figure 5A:
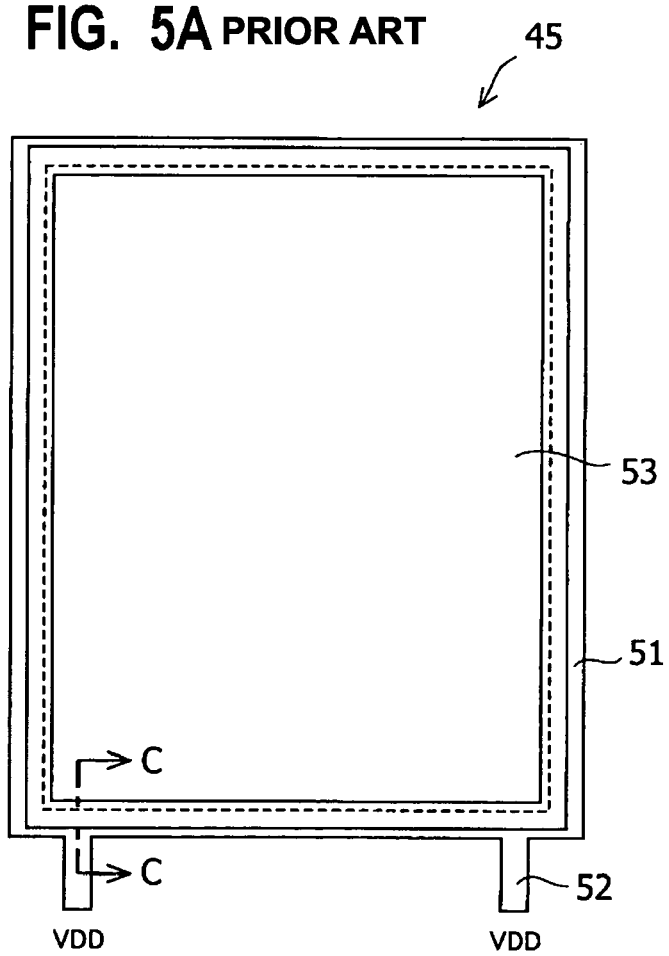
FIG. 5A is a plan view illustrating an upper common electrode of a solid wiring structure common to all the pixels.
Figure 5B:
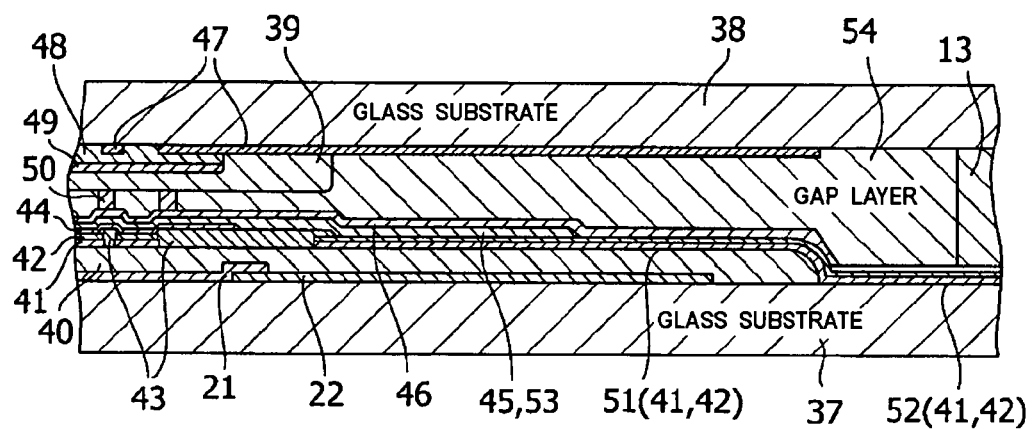
FIG. 5B is a cross-sectional view along the C-C line in FIG. 5A.

The source wiring pattern 56 is provided as a wiring for the source of the TFT 32 shown in FIG. 3. A base end portion of the source wiring pattern 56 is connected to a point Pa of the power source line 210, and a distal end portion is split in a comb-like fashion, thereby forming branch portions 56a, 56b parallel to the power source line 210.

The drain wiring pattern 57 is provided as a wiring for the drain of the TFT 32. A base end portion of the drain wiring pattern 57 is positioned above the wiring pattern 59 for bypass formation. The drain wiring pattern 57 has a branch portion 57a extending from this base end portion between the branch portions 56a, 56b of the source wiring pattern 56 and a branch portion 57b extending from the base end portion between the branch portion 56b and the power source line 210. In other words, the drain wiring pattern 57 has comb-shaped branch portions meshing with the comb-shaped branch portions of the source wiring pattern 56.

The number of branches in the source wiring pattern 56 and the number of branches in the drain wiring pattern 57 may be equal to or larger than three.

Figure 7B:
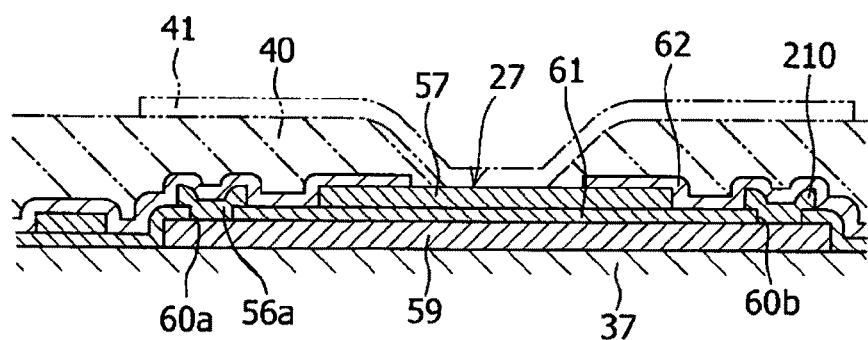
FIG. 7B is a cross-sectional view along the D-D line in FIG. 7A.
Figure 7C:
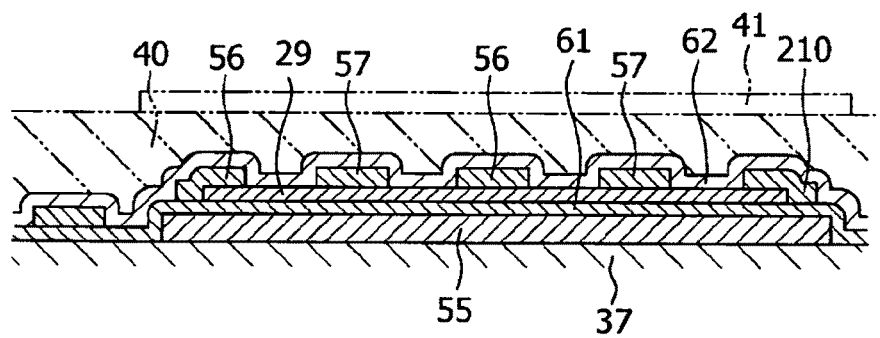
FIG. 7C is a cross-sectional view along the E-E line in FIG. 7A.

FIG. 7B and FIG. 7C show a D-D sectional view and an E-E sectional view of the configuration shown in FIG. 7A.

As shown in FIG. 7B, the wiring pattern 59 for bypass formation, which is a first-layer metal wiring pattern, is electrically connected at one end thereof to the source wiring pattern 56 (distal end portion of the branch portion 56a) via a contact hole 60a, and is also electrically connected at the other end thereof to the power source line 210 (point Pb in FIG. 7A) via a contact hole 60b.

Therefore, the source wiring pattern 56 and wiring pattern 59 for bypass formation configure a series of bypass line paths 66 (see FIG. 6) that exit from the power source line 210 and then again return to the power source line 210.

The base end portion of the drain wiring pattern 57 is disposed on an insulating layer 61 and above the wiring pattern 59 for bypass formation. A contact hole 27 that connects the drain wiring pattern 57 to an EL light-emitting element (not shown in the figure) is formed above the base end portion of the drain wiring pattern 57. As a result, the wiring pattern 59 for bypass formation is positioned below the region of the contact hole 27.

Positioning the wiring pattern 59 for bypass formation below the region of the contact hole 27 in the above-described manner brings the following advantages.

Because of concerns about stress and roughness, element patterns such as transistors are rarely disposed below a contact hole. Therefore, by locating the wiring pattern 59 for bypass formation below the region of the contact hole 27, a reduction in the effective area inside the pixels caused by the formation of the wiring pattern 59 for bypass formation can be avoided.

In FIG. 7B and FIG. 7C, the reference numeral 37 denotes a glass substrate, 40-a planarizing resin layer, 62-a passivation layer, and 41-a reflective electrode layer or a base layer.

With the flat panel display device in accordance with the present invention, a bypass line path 66 configured by the source wiring pattern 56 and the wiring pattern 59 for bypass formation is formed in each pixel circuit 240. These bypass line paths 66 are connected in parallel to the power source lines 210. Therefore, in each power line 210 shown in FIG. 6, the electric resistance of the site where the bypass line paths 66 are connected in parallel is reduced.

The decrease in electric resistance inhibits a voltage drop (rise) in each power source line 210 and, therefore, reduces power consumption. Furthermore, because the decrease in electric resistance increases the uniformity of voltage applied to light-emitting elements of the pixel circuits 240 connected to the power source lines 210, the so-called brightness unevenness is reduced.

Because the bypass line path 66 is configured using the source wiring pattern 56, as described above, as a wiring for the source of the TFT 32, the bypass line path can be easily realized without reducing the surface area of the transistor in the pixel circuit 240. In other words, the bypass line path 66 can be realized without requiring special disposition space inside the pixel circuit 240.

As shown in FIG. 7A, in the present embodiment, an end portion of the gate wiring pattern 55 is positioned below the power source line 210, but this end portion may be also positioned not only below the power source line 210.

The power source bus 220 shown in FIG. 6 will be explained below. In the power source bus 220, slits 71 are formed in an upper line path portion 221 having one end of each power source line 210 connected thereto and in a lower line path portion 222 having the other end of each power source line 210 connected thereto.

A plurality of slits 71 are formed from both ends of the line path portion 221 (222) along the longitudinal direction of the line path portion 221 (222). These slits 71 are so formed that the length thereof decreases inward (pixel region side) of the line path portion 221 (222) and the width of portions split by the slits decreases inward the line path portion 221 (222).

With such a configuration, the electric resistance from the power source terminal 230 is higher in those power source lines 210 that are closer to the power source terminal 230. Therefore, the so-called brightness unevenness is reduced.

Thus, if the slits 71 were not provided, the electric resistance from the power source terminal 230 would be lower in those power source lines 210 that are at a short distance from the power source terminals 230. Therefore, the brightness of light-emitting elements to which power is supplied via the power source lines 210 located close to the power source terminals 230 would be higher than the brightness of the light-emitting elements to which power is supplied via the power source lines 210 located far from the power source terminal 230, so brightness unevenness would occur.

In contrast, when the slits 71 are provided, the electric resistance between the power source terminal 230 and the power source lines 210 is averaged by the slits 71. Therefore, the above-described brightness unevenness is effectively inhibited.

When only one power source terminal 230 is provided, a group of slits extending from one end portion (the end portion on the side close to the power source terminal 230) of the line path portion 221 (222) toward the other end portion may be provided. In this case, the number, spacing, and length of the slits are appropriately set so as to average the electric resistance between the power source terminal 230 and the power source lines 210.

Another means for reducing the resistance of the power source bus 220 will be considered below. The data signal lines 25 or scan signal lines 26 cross the power source bus 220, while being insulated therefrom, but the power source bus is not necessarily crossed over the entire surface. Accordingly, the electric resistance of the power source bus 220 can be reduced by laminating a conductive layer on a portion where the power source bus is not crossed by the scan signal lines 26, as shown by hatching and the reference numeral 220a in FIG. 6.

The right line path of the bus 220 is not crossed by the scan signal lines 26, but the conductor is laminated in the same manner as in the left line path to ensure symmetry of electric resistance with the left line path.

An example based on the configuration shown in FIGS. 6, 7A, 7B, and 7C will be explained below. Pixels of the panel have a size of 60 μm×180 μm×RGB, the number of pixels is 240 RGB (horizontal)×320 (vertical) of QVGA, the screen size is about 3 inch, the allowed width of the power source bus is about 2 mm, and power source terminals are led out in two places.

Within the screen, 240×3 power source lines 210 with a width of about 8 μm were disposed to connect linearly the 320 pixels in the vertical direction, and both ends of the power source lines were connected to the power source bus 220. Within each pixel, a circuit pattern such as a transistor was formed by a wiring with a width of about 3 to 5 μm. The pixels were controlled by connecting the signal lines 25, 26 with a control IC (an integrated circuit including the data control circuit 17 and the gate control circuit 18) located outside the screen.

When a power source line pattern on the cathode side was designed, a line path pattern having a bypass structure was formed for each pixel circuit 240 by connecting the source wiring pattern 56 and the power source lines 210 at two points in the longitudinal direction of the pixels, with consideration for the fact that the source wiring pattern 56 of the main transistors (TFT 32 in FIG. 3) has the same potential as the cathode. In this case, in order to use effectively the space inside the pixels, a structure was used in which the wiring pattern 59 for bypass formation passes below the contact hole 27 of the planarizing resin layer 40 where the circuit pattern is usually not located, as shown in FIGS. 7A and 7B. It goes without saying, that the wiring crossing locations were designed to sandwich an insulating film.

The source wiring pattern 56 and power source lines 210 were connected to the wiring pattern 59 for bypass formation via the respective contact holes 60a and 60b, thereby forming bypass lines 66 inside the pixels.

The bypass lines 66 inside the pixels were connected in parallel to the power source lines 210. In this case, the wiring resistance can be reduced by about 30% with respect to that of power source lines 210.

Figure 8A:
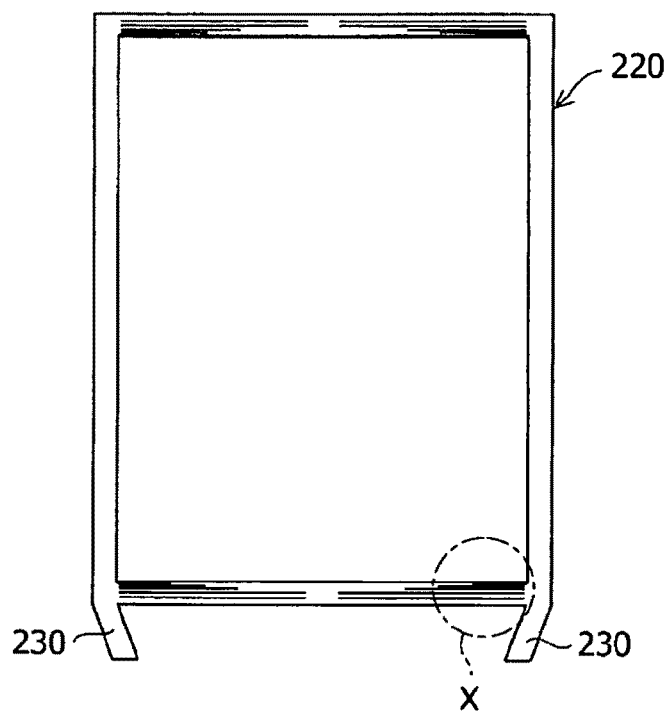
FIG. 8A is an overall view of a power source bus (cathode side).
Figure 8B:
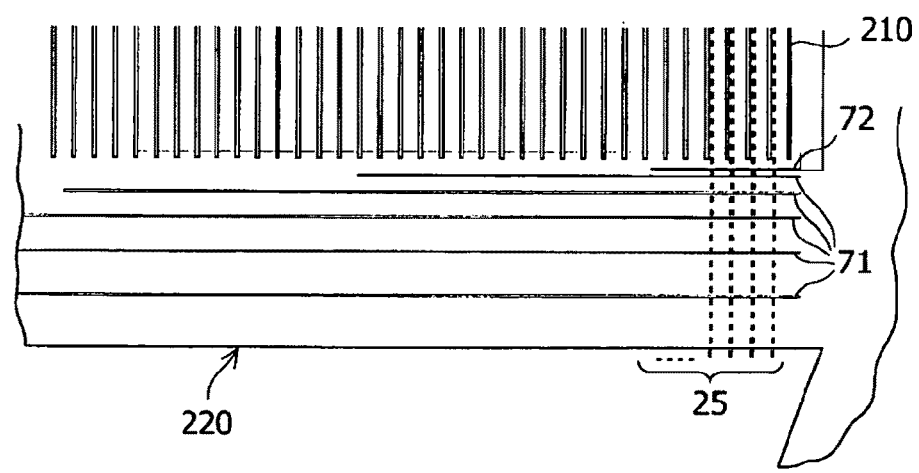
FIG. 8B is an enlarged view of a slit portion.

As shown in FIG. 8A, a pattern employed for the power source bus 220 had four six-split structural portions formed by slits 71, 72 shown in FIG. 8B (enlarged view of X portion in FIG. 8A). Because the panel shown in FIG. 8A basically had a left-right symmetry, a total of 60 power source lines 210 which represented ⅙ of 120×RGB=360 power source lines corresponding to half all the pixels were considered as one block, and the width of portions split by the slits 71, 72 was set so as to correspond to the ratio of distance from the power source terminal 230 to individual blocks.

The width of slits 71, 72 is much smaller (about 10 μm) than the width (about 2 mm) of the entire power source bus. Furthermore, each slit 71 has a shape with a closed outer border within the power source bus 220, and the slit 72 has a shape such that the outer border is not closed within the power source bus 220.

When a TFT substrate (circuit board 110 shown in FIG. 6) was fabricated, a MoCr film with a thickness of 400 nm was formed by sputtering on an alkali-free glass (AN-100, manufactured by Asahi Glass Co., Ltd.) with a size of 200 mm×200 mm×0.7 mm (thickness), and then a predetermined metal pattern of the first layer including the power source bus pattern shown in FIG. 8A was formed by photolithography.

An inorganic insulating film constituting the insulating layer 61 (see FIG. 7C) was then formed on the metal pattern, and an amorphous Si layer was formed thereupon as the Si layer 29. Then, a MoCr film of the second layer was formed by sputtering to a thickness of 300 nm, and a pattern was obtained by photolithography. The MoCr film of the second layer formed power source lines 210 linking together the 320 (vertical) pixels and connected at both ends to the power source bus 220. The MoCr film of the second layer was also used for the scan signal lines 26 striding over the power source bus 220 produced by the first-layer metal. However, because there was also a space that is not used as the signal line, a structure was obtained in which the power source bus 220 partially had a multilayer wiring portion 220a, as shown in FIG. 6. The MoCr layers stacked in the vertical direction were connected by a plurality of contact holes that were formed in advance by dry etching in the insulating film.

After the MoCr film of the second layer was formed, a passivation film (SiN 300 nm) was formed in a CVD apparatus and openings for connecting organic EL elements and terminal openings were formed by dry etching. Then, a planarizing resin layer 40 with a thickness of about 2 μm was formed by photolithography, and wiring steps were reduced. Contact holes 27 with a gentle taper angle were also formed in the connection portions of TFT and organic EL elements. After photoprocessing, the TFT substrate was baked for about 1 hour at a temperature of about 220° C. and moisture contained in the planarizing resin layer 40 was removed. Thus, the process is not different from that of the fabrication of a usual amorphous Si-TFT substrate.

Organic EL elements were then formed. A $SiO_2$ passivation film with a thickness of 300 nm was formed by sputtering of the TFT substrate and openings were provided by dry etching in the contact hole portions or terminal portions. Then, IZO as the base layer 41 was formed by sputtering to a thickness of 50 nm for improving adhesion. In this case, an RF-planar magnetron was used as a sputtering apparatus and Ar was used as the gas.

The IZO layer was connected to the TFTs via the contact holes 27 provided in the planarizing resin layer 40 and passivation layer 62. Then, an Ag alloy was sputtered to a thickness of 100 nm on the IZO layer, a resist agent "OFRP-800" (a trade name, manufactured by Tokyo Oka KK) was coated on the sputtered layer, followed by exposure and development. Reflective electrodes 42 that were island-like separated for each sub-pixel were formed by photoetching. An IZO film with a thickness of 30 nm was formed thereupon, and an island-like pattern was formed by a similar process to cover the reflective electrodes 42 from the Ag alloy. In this case, the aforementioned base layer 41 was patterned at the same time and separated into individual electrodes. A novolac resin film ("JEM-700R2", manufactured by JSR) with a thickness of 1 µm was coated by a spin coating method on the island-like reflective electrodes 42 covered with IZO, and an organic insulating film 43 was formed by photolithography so as to open windows in the light emission zones.

The structure obtained was placed into a vapor deposition apparatus with resistance heating, Li was deposited to a thickness of 1.5 nm on the reflective electrodes 42, and a cathode buffer layer was obtained. An electron transport layer, a light-emitting layer, a hole transport layer, and a hole injection layer were then formed in the order of description, without breaking the vacuum. In this layer formation process, the vacuum inside the vacuum vessel was reduced to $1 \times 10^{-4}$ Pa. Each layer was deposited at a vapor deposition rate of 0.1 nm/sec. Thus, tris(8-hydroxyquinolinoto)aluminum (Alq3) with a film thickness of 20 nm was used as the electron transport layer, 4,4'-bis(2,2'-diphenylvinyl)biphenyl (DPVBi) with a film thickness of 30 nm was used as the light-emitting layer, 4,4-bis[N-(1-naphthyl)-N-phenylamino]biphenyl (α-NPD) with a film thickness of 10 nm was used as the hole transport layer, and copper phthalocyanine (CuPc) with a film thickness of 100 nm was used as the hole injection layer. Furthermore, MgAg was vapor deposited to a thickness of 5 nm thereupon, and a layer for damage relaxation during sputtering of a transparent electrode was obtained. The structure was transferred into an opposing sputtering apparatus, without breaking the vacuum, and an IZO film with a thickness of 200 nm was formed as the transparent electrode 45. In these vapor deposition or sputtering processes, a metal mask of an open-area shape in which a tetragonal window was opened in a position corresponding to the display was employed. The substrate was then transferred into a CVD apparatus, without breaking the vacuum, and a SiN film with a thickness of 2 µm was formed as the barrier layer 46 over the entire surface.

As for the side of the color filter substrate, the black matrix 47 (CK-7001, manufactured by Fuji Film ARCH) with a thickness of 1 µm was formed by photolithography on alkali-free glass (Eagle 2000; manufactured by Corning Co.) with a size of 200 mm×200 mm×0.7 mm (thickness). Then, color filters 48 were formed by photolithography: red color (CR-7001, manufactured by Fuji Film ARCH), green color (CG-7001, manufactured by Fuji Film ARCH), and blue color (CB-7001, manufactured by Fuji Film ARCH). Each filter had a rectangular shape with a thickness of about 1.5 µm. A back structure in which a rectangular partition wall 39 extended in the same direction as the rectangles of the color filters was formed on the black matrix by photolithography by using a photosensitive resin (CR-600, manufactured by Hitachi Chemical Co., Ltd.). The back partition wall had a width of about 14 µm and a height of about 5 µm. The same photosensitive resin was again coated thereupon, and spacers 50 were formed by photolithography. The spacers 50 had a diameter of about 15 µm and a height of about 2 µm and were located in positions hidden by the black matrix.

The color filter substrate was then dried by heating, set in a multinozzle ink jet apparatus (which had a landing accuracy of about ±5 µm) that was set in an environment with an oxygen concentration of 50 ppm and a nitrogen concentration of equal to or lower than 50 ppm, alignment was performed with a marker produced at the black matrix, and then red and green color conversion materials dissolved in a solvent were coated by scanning over the entire screen, the trajectory of flying particles being aimed at the bank center portion of a pixel corresponding to a respective color. Drying was then performed at a temperature of 100° C., without breaking the nitrogen atmosphere (omitted with respect to color conversion materials).

The organic EL substrate and color filter substrate were then transferred to an adhering device maintained under an environment with an oxygen concentration of 5 ppm and a moisture content of equal to or less than 5 ppm. The process surface of the color filter substrate was set to face up, an epoxy UV-curable adhesive (XNR-5516, manufactured by Nagase Chemtex Corp.) was covered without seams by using a dispenser on the outer periphery of each of a plurality of screens, a so-called "bank" was formed, and then a heat-curable epoxy adhesive of low viscosity was dropped close to the center of each screen. A rotary mechanical metering valve with a discharge accuracy within 5% was used as the dropping device.

The process surface of the TFT substrate having the organic EL elements formed thereon was then set face down, the pressure was reduced to about 10 Pa in a state in which the color filter substrate and the process surface faced each other, then the two substrates were brought as close as about 30 µm to each other, and in a state in which the entire periphery of the outer circumferential sealing material was in contact with the organic EL substrate, pixel positions of the two substrates were aligned with an alignment device, the pressure was returned to the atmospheric pressure, and a slight load was applied.

The dropped heat-curable epoxy adhesive was spread to the peripheral portion of the panel, and a spacer distal end of the color filter substrate came into contact with the TFT substrate provided with organic EL elements and stopped. Preliminary curing was performed by irradiating UV radiation via a mask from the color filter substrate side on the outer peripheral sealing portion, followed by removal into the general environment.

Figure 1:
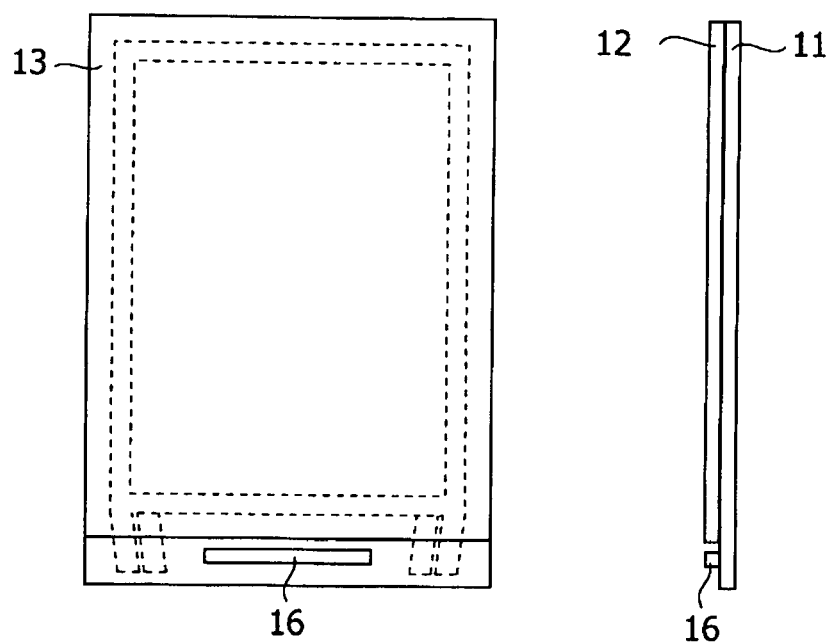
FIG. 1 is an overall view illustrating a typical organic EL panel unit of a top-emission type.

The resultant configuration was then divided into individual panels (there was no IC (control integrated circuit) at this stage) by using an automatic glass scriber and a breaking apparatus. The panel was placed in a heating furnace, heated for 1 hour at a temperature of 80° C., autonomously cooled for 30 minutes inside the furnace, and removed from the furnace. The panel was then introduced into a dry etching device, and a barrier layer with a thickness of 2 µm that covered the terminal portions 15 and IC connection pads was removed. Finally, the control IC was COG connected and a panel unit such as shown in FIG. 1 was produced.

In the conventional panel, the brightness unevenness in a full-surface switch-on mode was about 40% (based on the flowing electric current value) for the entire screen, but when the power source lines 210 were used in which the resistance was reduced by about 30% with bypass structures in accordance with the present invention, the brightness unevenness could be reduced to about 30% under the same conditions. Furthermore, when the power source bus 220 with slits 71, 72 was used in such a configuration, the brightness unevenness could be reduced to about 10 to 20% under the same conditions and practically could not be seen. Furthermore, the power consumed by the wirings could be also reduced to the extent to which a GND potential increase was inhibited.

In order to further reduce the brightness unevenness, it is possible to obtain, for example by simulation, a factor for correcting a one-dimensional brightness distribution along the power lines 210 into a flat distribution, set this factor in the image control circuit, and correct the one-dimensional brightness distribution with software.

As discussed above, unevenness in brightness and an increase in power consumption caused by wiring resistance can be inhibited without changing the wiring material or increasing costs. Therefore, the invention can be effectively applied to thin displays such as organic EL panels and liquid-crystal panels.

The invention claimed is:

1. A flat panel display device, comprising:
   a circuit board that has formed thereon a plurality of power source lines arranged at spaced-apart positions, a power source bus to which the plurality of power source lines are connected, a plurality of pixel circuits, and a plurality of light-emitting elements each driven by a transistor provided in a corresponding one of the plurality of pixel circuits,
   wherein at least one of the pixel circuits includes an inner line path having a first end portion that is connected to one of the power source lines and a second end portion that is also connected to said one of the power source lines so as to provide a bypass wiring path with respect to said one of the power source lines, both the inner line path and the bypass wiring path being shared with none of the other pixel circuits,
   wherein the inner line path includes a straight segment that is parallel to but not coaxial with a straight segment of said one of the power source lines; and
   wherein a part of the inner line path is different from and branches off of said one of the power source lines.

2. The flat panel display device according to claim 1, further comprising:
   a planarizing layer for planarizing concavities and convexities due to circuit elements on the circuit board, the planarizing layer having contact holes for connecting the pixel circuits to the light-emitting elements,
   wherein part of the inner line path of said at least one of the pixel circuits is located below one of the contact holes.

3. The flat panel display device according to claim 1, wherein the light-emitting elements are organic EL elements.

4. The flat panel display device according to claim 1, wherein the transistors are thin-film transistors.

5. The flat panel display device according to claim 1, wherein the inner line path comprises:
   a first line path portion having the first end portion that is connected to said one of the power source lines and another end portion provided with a plurality of branch portions; and
   a second line path portion having the second end portion that is connected to said one of the power source lines and a further end portion that is connected to at least one of the branch portions,
   wherein the first line path portion comprises a source terminal of the transistor, and
   wherein the straight segment of the inner line path is included in the first line path portion.

6. The display device according to claim 5, wherein said at least one of the pixel circuits further comprises a third line path portion having branch portions disposed to alternate with the branch portions of the first line path portion, the third line path portion comprising a drain terminal of the transistor.

7. The flat panel display device according to claim 1,
   wherein the power source bus has a first linear segment and a second linear segment extending substantially perpendicularly from the first linear segment;
   wherein said one of the power source lines is connected to the second linear segment of the power source bus and extends substantially parallel to the first linear segment of the power source bus.

8. The flat panel display device of claim 7, wherein the power source line has a longitudinal axis, and wherein the second linear segment of the power source bus has a slit that extends across the longitudinal axis, the slit having a length that is less than the length of the second linear segment of the power source bus.

9. The flat panel display device according to claim 1, wherein a wiring pattern of the transistor that is provided in said at least one of the pixel circuits is included in the inner line path.

10. The flat panel display device according to claim 1, wherein
    at least two pixel circuits have respective inner line paths with first and second end portions, and
    the first and second end portions of the inner line paths of the at least two pixel circuit are connected to said one of the power source lines.

11. The flat panel display device according to claim 1, wherein a plane that is perpendicular to the display device, and also perpendicular to the straight segment of the inner line path, passes through said one of the power source line.

12. The flat panel display device according to claim 1, wherein the straight segment of the inner line path does not include one of a source electrode and a drain electrode.

13. The flat panel display device according to claim 1, wherein a plane that is non-parallel to the display device, and also non-parallel to the straight segment of the inner line path, passes through said one of the power source lines.

14. The flat panel display device according to claim 1, wherein the first line path portion has a first segment that is not coaxial to the power source line and a second segment that is connected to the first segment and that is parallel to the power source line, the first and second segments of the first line path portion being disposed in a plane in which the power source line is also disposed.

15. A flat panel display device, comprising:
    a circuit board that has formed thereon a plurality of power source lines arranged at spaced-apart positions, a power source bus to which the plurality of power source lines are connected, a plurality of pixel circuits, and a plurality of light-emitting elements each driven by a transistor provided in a corresponding one of the plurality of pixel circuits,
    wherein at least one of the pixel circuits includes an inner line path having a first end portion that is connected to one of the power source lines and a second end portion that is also connected to said one of the power source lines so as to provide a bypass wiring path with respect to said one of the power source lines, both the inner line path and the bypass wiring path being shared with none of the other pixel circuits, and
    wherein the inner line path comprises:
      a first line path portion having the first end portion, the first line path portion being located in a first layer in which said one of the power source lines is also located, and
      a second line path portion having the second end portion, the second line path portion being located in a second layer which is different from the first layer; and wherein a part of the inner line path is different from and branches off of said one of the power source lines.

16. The flat panel display device according to claim 15, further comprising:
a planarizing layer for planarizing concavities and convexities due to circuit elements on the circuit board, the planarizing layer having contact holes for connecting the pixel circuits to the light-emitting elements,
wherein part of the inner line path of said at least one of the pixel circuits is located below one of the contact holes.

17. The flat panel display device according to claim 15, wherein the light-emitting elements are organic EL elements.

18. The flat panel display device according to claim 15, wherein the transistors are thin-film transistors.

19. The flat panel display device according to claim 15, wherein
the first line path portion has a plurality of branch portions,
the second line path portion is connected to at least one of the branch portions, and
the first line path portion comprises a source terminal of the transistor.

20. The flat panel display device according to claim 19, wherein
said at least one of the pixel circuit further comprises a third line path portion having a branch portions that are disposed to alternate with the branch portions of the first line path portion, the third line path portion comprising a drain terminal of the transistor.

21. The flat panel display device according to claim 15, wherein
the power source bus has a first linear segment and a second linear segment extending substantially perpendicularly from the first linear segment; and
said one of the power source lines is connected to the second linear segment of the power source bus and extends substantially parallel to the first linear segment of the power source bus.

22. The flat panel display device of claim 21, wherein said one of the power source lines has a longitudinal axis, and wherein the second linear segment of the power source bus has a slit that extends across the longitudinal axis, the slit having a length that is less than the length of the second linear segment of the power source bus.

23. The flat panel display device according to claim 15, wherein a wiring pattern of the transistor that is provided in said at least one of the pixel circuits is included in the inner line path.

24. The flat panel display device according to claim 15, wherein
at least two pixel circuits have respective inner line paths with first and second end portions, and
the first and second end portions of the inner line paths of the at least two pixel circuit are connected to said one of the power source lines.

25. The flat panel display according to claim 15, wherein the first line path portion does not include a source electrode or a drain electrode.

26. The flat panel display according to claim 15, wherein the first line path portion has a first segment that is perpendicular to the power source line and a second segment that is connected to the first segment and that is parallel to the power source line, the first and second segments of the first line path portion being disposed in a plane in which the power source line is also disposed.

* * * * *